(12) United States Patent
Lou

(10) Patent No.: US 7,064,575 B2
(45) Date of Patent: Jun. 20, 2006

(54) METHOD AND SYSTEM FOR ADAPTIVELY CONTROLLING OUTPUT DRIVER IMPEDANCE

(75) Inventor: Perry W. Lou, Carlsbad, CA (US)

(73) Assignee: Semtech Corporation, Camarillo, CA (US)

( * ) Notice: Subject to any disclaimer, the term of this patent is extended or adjusted under 35 U.S.C. 154(b) by 105 days.

(21) Appl. No.: 10/931,646

(22) Filed: Aug. 31, 2004

(65) Prior Publication Data
US 2006/0044007 A1    Mar. 2, 2006

(51) Int. Cl.
*H03K 19/003* (2006.01)
(52) U.S. Cl. .......................... 326/30; 326/27
(58) Field of Classification Search ............ 326/30
See application file for complete search history.

(56) References Cited

U.S. PATENT DOCUMENTS

| | | | |
|---|---|---|---|
| 6,509,755 B1 * | 1/2003 | Hernandez-Marti | 326/30 |
| 6,573,746 B1 * | 6/2003 | Kim et al. | 326/30 |
| 6,836,170 B1 * | 12/2004 | Kitagawa et al. | 327/308 |

* cited by examiner

*Primary Examiner*—James H. Cho
(74) *Attorney, Agent, or Firm*—O'Melveny & Myers LLP

(57) ABSTRACT

An adaptive output driver circuit utilizes an initial point matched impedance model to match the impedance of an output driver to the transmission line and produce an initial step voltage into the transmission line that is half of the desired final voltage. The driver output impedance is controlled by comparing a model of the actual working output stage to a target resistance given by the user. Control signals used to calibrate the impedance of the model to match the target are also used to adjust the working output buffer, so that when the impedance of the model matches the target, the impedance of the working buffer also matches the target impedance.

22 Claims, 3 Drawing Sheets

METHOD AND SYSTEM FOR ADAPTIVELY CONTROLLING OUTPUT DRIVER IMPEDANCE

BACKGROUND OF THE INVENTION

1. Field of the Invention

The present invention relates to impedance matching of a digital output driver to a transmission line, and more particularly, to an adaptive output driver circuit that comprehends variations in circuit impedance due to manufacturing variation, power supply levels, and temperature, and adjusts its output impedance to match the transmission line impedance.

2. Description of Related Art

Digital electronic circuits often produce output signals that are communicated to other electronic circuits via a transmission line, and for that reason it is known to include an output driver for the purpose of generating the output signals having desired voltage and timing characteristics. In order to achieve high speed signaling, the impedance of the transmission line must be matched to either the source of the output signal and/or the destination (or load) in order to avoid reflections of the output signals that degrade the timeliness of the signal communication. Source impedance matching is achieved by matching the impedance of the output driver to the impedance of the transmission line. With source impedance matching, the output signal will pass from the output driver onto the transmission line without reflection. The signal will then propagate down the transmission line to the load. If there is an impedance mismatch at the load end, the signal will be reflected back down the transmission line to the source, and the reflected signal will be terminated at the source end by the impedance match.

There are several known methods for achieving source impedance matching. One such method is to add an external series resistor to a low impedance output driver so that their sum approximates the impedance of the transmission line. FIG. 1 illustrates an exemplary source impedance matched output driver communicating with a device under test through a transmission line. Specifically, an output driver 12 drives a capacitive load 34 of a device under test or DUT 32 through a transmission line 20. The output driver 12 has an impedance $Z_d$, and the transmission line 20 has a characteristic impedance $Z_o$. A series resistor 14 having a resistance $R_s$ is coupled in series between the output driver 12 and the transmission line. The series resistor 14 is selected such that transmission line impedance $Z_o$ equals the sum of the output driver impedance $Z_d$ plus the resistance $R_s$.

A closed-loop amplifier may be used as the output driver due to its very low impedance so that most of the required source matching impedance appears in the added series resistor. A drawback of this approach is that low impedance output drivers tend to be physically large, requiring additional component and board area space as well as additional power. Alternatively, an open-loop output driver may be used, such as a simple digital buffer, which takes up less space and has lower power requirements. But, the impedance of the open-loop output driver is significant in comparison with the transmission line impedance, is non-linear, and (for MOS circuitry) varies greatly with processing and temperature changes. As a result, resistor selection for an open-loop output driver is often difficult.

An additional consideration is that it is desirable to include the series resistor within the same integrated circuit package as the output driver in order to minimize the additional external circuitry. This further exacerbates the difficulty in selecting an appropriate series resistor since it is difficult to produce a resistor on an integrated circuit that is stable over the processing and environmental conditions. In some cases, the resistance value may vary by as much as 50%, making it very difficult to accurately match the transmission line impedance. A trimmable thin-film resistor may be used to provide on-chip integration of the series resistor, or fusible links may be incorporated with a resistor array that enables selection during manufacture of an appropriate net series resistance. Both of these approaches tend to extend unit testing, and may be susceptible to aging and environmental variations. They can also raise additional quality assurance concerns above standard processing.

Another known approach to achieving source impedance matching is to designing the size of the transistors of the output driver to have the required resistance. In CMOS design, this is done by specifying the width of the output devices. This approach also has drawbacks in that the variation in typical manufacturing processes can cause the transistor output impedance to vary significantly. Moreover, the transistor output impedance further varies with power supply levels and temperature.

Signal inspection based control systems have also been proposed. One such control system examines the initial step amplitude when the output driver launches a signal transition into the transmission line. In a matched system, the initial step amplitude is ideally half of the total amplitude of the digital signal specification. Another such control system requires a round-trip external loop made of the transmission line, and matches the resulting signal at the end of the loop with the intended drive signal by integrating both signals. These control loops require constant signal transmission, and may require a dedicated, sample transmission line.

Yet another approach is to provide closed-loop, continuous-time impedance matching using feedback and high-gain op-amps for driving analog signals onto controlled-impedance cabling. These are complex designs requiring fast op-amps, careful AC stability analyses, and usually, external resistors for the feedback network because of the resistance accuracy required.

Accordingly, a need exists for an adaptive output driver circuit that detects variations in circuit impedance due to manufacturing variation, power supply levels, and temperature, and adjusts its output impedance to match the transmission line impedance, while overcoming the drawbacks of the known source impedance matching approaches.

SUMMARY OF THE INVENTION

The present invention overcomes these drawbacks of the prior art by providing an adaptive output driver circuit that utilizes an initial point matched impedance model to match the impedance of an output driver to the transmission line and produce an initial step voltage into the transmission line that is half of the desired final voltage. The driver output impedance is controlled by comparing a model of the actual working output stage to a target resistance given by the user. Control signals used to calibrate the impedance of the model to match the target are also used to adjust the working output buffer, so that when the impedance of the model matches the target, the impedance of the working buffer also matches the target impedance.

More particularly, the output driver circuit comprises three major servo loops. The first servo loop compares a reference resistor reflecting the transmission line impedance to a resistor array and produces a digital signal corresponding to the appropriate selection of resistors of the array that matches the reference resistor. The second and third servo loops scale the resistance selection for the high (VH) and low (VL) output voltage rails for digital signal communication on the transmission line (corresponding to data states 1 and 0, respectively). The second servo loop generates a bias current $I_b$ that is used in the third servo loop produce a digital signal to adjust the size of transistors in order to select the impedance of the output driver. As a result, the transistor sizes of the output driver are adjusted so that the output voltage launched onto the transmission line is one-half of the desired final voltage $V_f$, thereby accomplishing matching of the output driver to the transmission line.

In an embodiment of the invention, a circuit for communicating digital output signals onto a transmission line is provided. A first servo generates a first digital signal defining a model resistance that substantially matches a predetermined impedance of the transmission line. A second servo receives the first digital signal and scales the model resistance for high (VH) and low (VL) output voltage rails of the transmission line. The second servo generates bias current corresponding to the scaled model resistance. A third servo receives the bias current and generates a second digital signal substantially correlating the scaled model resistance to a model transistor array. An output driver having a working transistor array is adapted to be coupled to the transmission line. The output driver receives the second digital signal and activates selected transistors of the working transistor array in accordance therewith so that the working transistor array has an impedance substantially corresponding to the scaled model resistance. As a result, the impedance of the working transistor array substantially matches the predetermined impedance of the transmission line, and a digital output signal communicated by the output driver onto the transmission line has a voltage that is substantially one-half of a desired final voltage.

A more complete understanding of the method and apparatus for controlling the output current of a low duty cycle power converter to avoid current overshoot caused by a step down in load will be afforded to those skilled in the art, as well as a realization of additional advantages and objects thereof, by a consideration of the following detailed description of the preferred embodiment. Reference will be made to the appended sheets of drawings that will first be described briefly.

DETAILED DESCRIPTION OF THE PREFERRED EMBODIMENT

Figure 1:
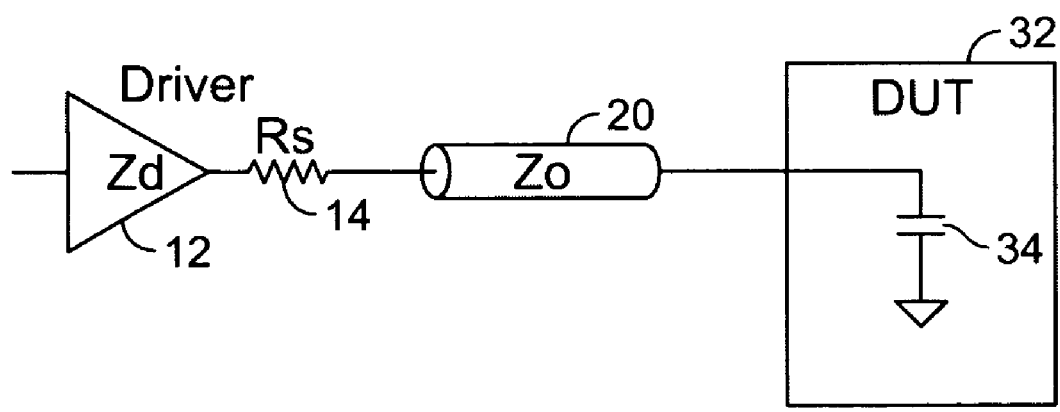
FIG. 1 is a schematic diagram illustrating a prior art source impedance matched output driver communicating with a device under test through a transmission line.

The present invention satisfies the need for an adaptive output driver circuit that detects variations in circuit impedance due to manufacturing variation, power supply levels, and temperature, and adjusts its output impedance to match the transmission line impedance. In the detailed description that follows, like element numerals are used to describe like elements illustrated in one or more of the figures.

In accordance with the present invention, an initial point matched impedance model is adopted in which the large signal resistance of the source matches the impedance of the transmission line at the initial signal launch. The initial step voltage into the transmission line is half of the final voltage (i.e., $V_f/2$), since the source resistance forms a 2:1 voltage divider with the transmission line. The small capacitive load of the device under test can be considered an open circuit that generates a reflected wave having voltage equal to the incident wave and current opposite to the incident wave. After the round trip delay, these incident voltage and current waves attempt to pass onto the source resistance. As a result, the net source voltage is equal to the final voltage (i.e., $V_f/2+V_f/2$) and the net source current is zero (i.e., $I_f+(-I_f)$). In other words, the output current equals zero when the output voltage reaches $V_f$, so there is no reflection of the incident wave, and the transition ends. The output driver appears to be matched to the transmission line.

The present invention provides an adaptive output driver circuit that utilizes the initial point matched impedance model by matching the impedance of the output driver to the transmission line and by producing an initial step voltage into the transmission line that is half of the desired final voltage. The driver output impedance is controlled by comparing a model of the actual working output stage to a target resistance given by the user. Control signals used to calibrate the impedance of the model to match the target are also used to adjust the working output buffer, so that when the impedance of the model matches the target, the impedance of the working buffer also matches the target impedance. For non-linear output device resistance characteristics, which is generally the case, the calibration voltages equal the expected initial output signal levels of a matched buffer.

More particularly, the control system comprises three major servo loops. The first servo loop compares the transmission line impedance to a resistor array and produces a digital signal corresponding to the appropriate selection of resistors of the array that matches the transmission line impedance. The second and third servo loops scale the resistance selection for the high (VH) and low (VL) output voltage rails for digital signal communication on the transmission line (corresponding to data states 1 and 0, respectively). The second servo loop generates a bias current $I_b$ that is used in the third servo loop produce a digital signal to adjust the size of transistors in order to select the impedance of the output driver. As a result, the transistor sizes of the output driver are adjusted so that the output voltage launched onto the transmission line is one-half of the desired final voltage $V_f$, thereby accomplishing matching of the output driver to the transmission line.

Figure 2:
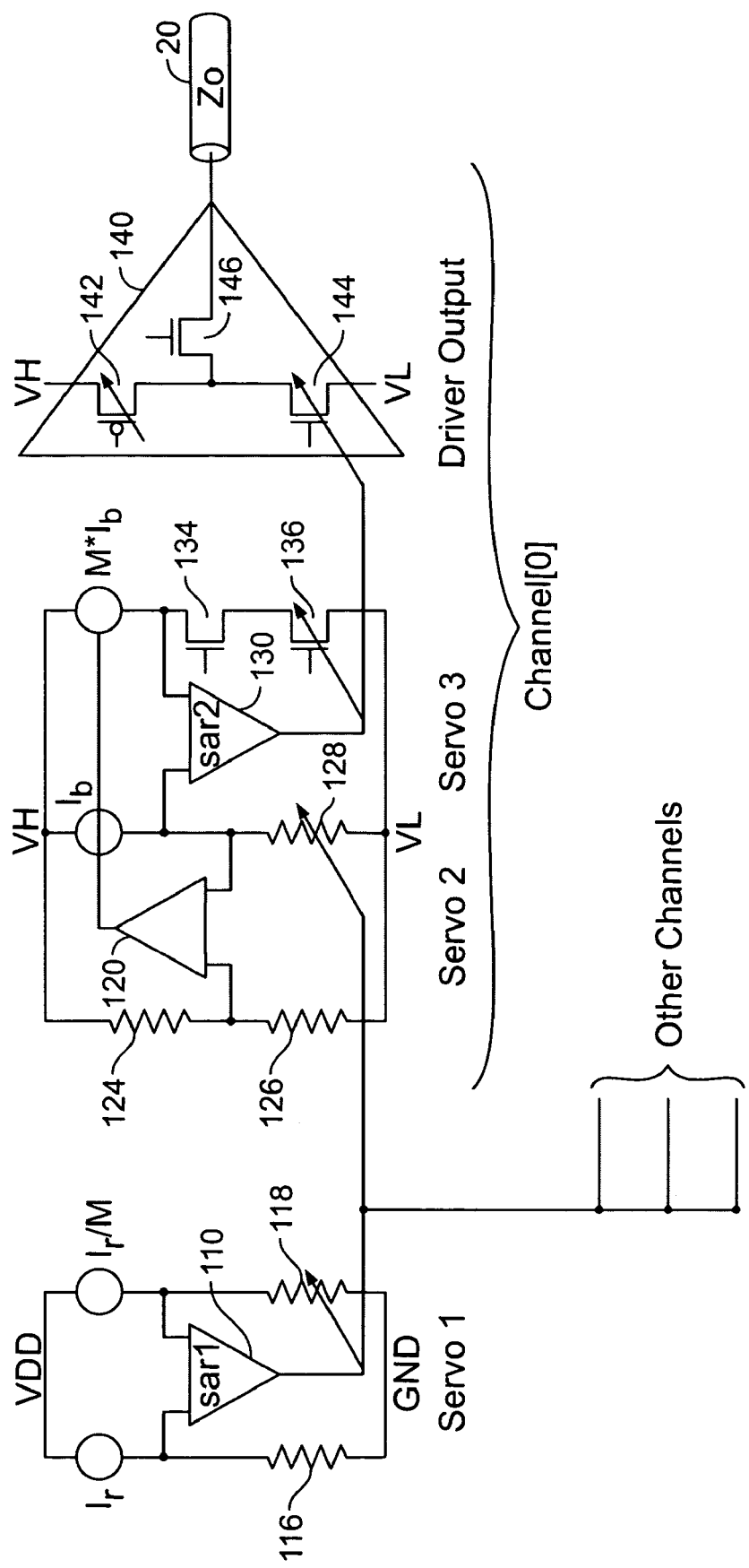
FIG. 2 is a schematic diagram illustrating an adaptive output control circuit for controlling output impedance in accordance with an embodiment of the invention.

Referring now to FIG. 2, an adaptive impedance control circuit is illustrated in accordance with an embodiment of the invention. As discussed above, the adaptive impedance control circuit would be included on an integrated circuit chip. The first servo loop includes a digital comparator 110, a reference resistor 116, and an adjustable equalization resistor 118. The reference resistor 116 has a reference resistance $R_{ref}$ that is selected to be proportional to the transmission line impedance $Z_o$, and may be coupled to the adaptive impedance control circuit from off-chip via an external pin. The equalization resistor 118 has an equalization resistance $R_{eq}$, and adjustable responsive to a digital signal produced by the digital comparator 110 (reflected in FIG. 2 by the diagonal arrow extending through the resistor symbol). In an embodiment of the invention, the equalization resistor 118 further comprises an array of parallel resistors formed on the integrated circuit chip. A desired equalization resistance $R_{eq}$ is achieved by selecting ones of the parallel resistors of the array.

The reference resistor 116 and equalization resistor 118 are coupled between the supply voltage (VDD) and ground (GND). The reference resistor 116 draws a reference current $I_r$, and the equalization resistor 118 draws a corresponding equalization current $I_r/M$, where M is a scaling factor. The digital comparator 110 compares the voltage across the reference resistor 116 with the voltage across the equalization resistor 118, and produces a digital output signal that is used to select one or more resistors of the array in order to define the value of the equalization resistance $R_{eq}$. In a preferred embodiment of the invention, the digital comparator further comprises a successive-approximation register (SAR). Instead of counting up in binary sequence, the SAR counts by trying all values of bits starting with the most-significant bit and finishing at the least-significant bit. Throughout the count process, the register monitors the comparator output to see if the binary count is less than or greater than the analog signal input, adjusting the bit values accordingly. The way the register counts is identical to the "trial-and-fit" method of decimal-to-binary conversion, whereby different values of bits are tried from MSB to LSB to get a binary number that equals the original decimal number. The advantage to this counting strategy is that the digital output converges on the analog signal input in much larger steps than with the 0-to-full count sequence of a regular counter. At the end of this process, the digital output corresponds to a ratio of resistances $R_{eq}/R_{ref}$ encoded as a digital value.

The digital output of the digital comparator 110 is provided to the second servo loop. The second servo loop includes comparator 120, resistors 124, 126, and an adjustable equalization resistor 128. The resistors 124, 126 are connected in series between the high (VH) and low (VL) output voltage rails, and define a voltage divider that produces a voltage equal to the average of the high and low output voltage rails (i.e., (VH+VL)/2), which is coupled to one input terminal of the comparator 120. The equalization resistor 128 has construction similar to the equalization resistor 118 of the first servo loop, and receives the same digital output signal produced by the first servo loop in order to produce the corresponding equalization resistance $R_{eq}$. The equalization resistor 128 is coupled between the low (VL) output voltage rail and another input terminal of the comparator 120. The comparator 120 produces a calibration current $I_b$ that is equal to $(VH+VL)/(2*R_{ref})$, corresponding to current that would be delivered to the transmission line. The comparator 120 may be provided by a conventional analog operational amplifier.

The third servo loop adjusts the model output stage, also relative to VH and VL, so that when the output stage conducts current equal to the calibration current $I_b$, the output voltage is equal to (VH+VL)/2. The third servo loop comprises a digital comparator 130, an n-channel FET 134, and an array of n-channel FETs 136. The array of n-channel FETs 136 are arranged in parallel with each individual FET having a predefined drain-source impedance $R_{ds1}$ such that by activating selected ones of the FETs, a total drain-source impedance may be selected. The array of n-channel FETs 136 correspond to the pull-down transistors of the output driver 140 (described below). Likewise, the n-channel FET 134 has a predefined drain-source impedance $R_{ds2}$ and corresponds to a series output switch of the output driver (also described below). The FETs 136 and FET 134 provide a model of the impedance of the output stage (i.e., $R_{ds1}$+$R_{ds2}$).

The digital comparator 130 is arranged in a similar manner as the digital comparator 110 of the first servo loop. Specifically, adjustable equalization resistor 128 has a resistance $R_{eq}$ and draws a bias current $I_b$, and the combination of the FET 134 and array of FETs 136 draw a corresponding bias equalization current $I_b/M$, where M is a scaling factor. The digital comparator 130 compares the voltage across the equalization resistor 128 with the voltage across the combination of the FET 134 and array of FETs 136, and produces a digital output signal that is used to select one or more FETs of the array 136 in order to define the value of the model impedance. In a preferred embodiment of the invention, the digital comparator 130 further comprises a successive-approximation register (SAR). The digital comparator generates a digital output that corresponds to a ratio of resistances $R_{out}/R_{eq}$ encoded as a digital value. At this point, the model output impedance $R_{out}$ is calibrated to $R_{ref}$, in accordance with the following equations:

$$R_{out}=((VH+VL)/2)/I_b$$

$$R_{out}=((VH+VL)/2)/((VH+VL)/(2*R_{ref}))$$

$$R_{out}=R_{ref}$$

The digital output of the third servo loop also adjusts the working driver output, so that it too is calibrated. The output driver 140 includes an array of parallel p-channel FETs 142 and an array of parallel n-channel FETs 144 coupled together and arranged in a push-pull configuration. An output control FET 146 is coupled between a phase node of the FETs 142, 144 and the transmission line 20, and has an impedance $R_{ds1}$ corresponding to the FET 134 of the third servo loop. The output control FET 146 enables the output driver 140 communication with the transmission line when activated, and is cut-off for lower leakage and high voltage isolation when the driver is deselected. The digital output of the third servo loop controls the selection of FETs 144 to have an impedance $R_{ds2}$ in the same manner as the FETs 136 described above, so that the model impedance is reflected in the working driver output. It should be appreciated that the third servo loop would additionally have a separate, identical servo and array of FETs in order to model the impedance of the parallel p-channel FETs 142, and this additional section is omitted from the drawing for simplicity.

The second and third servo loops and the driver output discussed above would provide one channel of a multiple-output system. The first servo loop and the reference resistor 116 would be common to each of the channels. This way, the user would need only select a single reference resistor corresponding to the transmission line impedance, and the impedance of each of the channels would be calibrated accordingly.

It should be appreciated that appropriate impedance scaling occurs at each servo, and between the calibration model and working output, so that the working output impedance is the desired value $Z_o$. The calibration is done separately for the pull-down and the pull-up portions of the driver output, and a model of the series output switch 146 is also included in each of the pull-up and pull-down calibrations. In the foregoing embodiment, the adjustment of the output impedance is implemented digitally (as digitally enabled arrays), so the third servo is digital, as is the first, and both of these servos use successive approximation as their convergence algorithm. It should also be appreciated that other digital or analog systems, including software and firmware implementations, could be advantageously utilized in place of successive-approximation registers.

Figure 3:
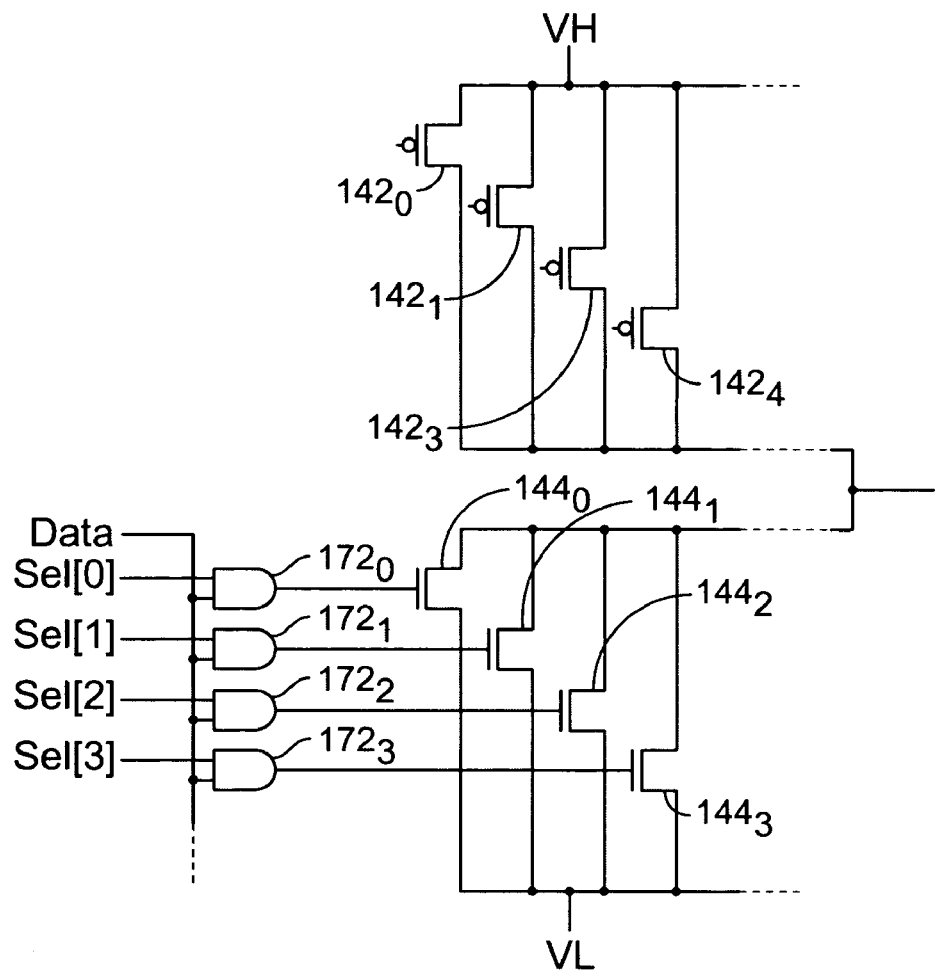
FIG. 3 is a schematic diagram of an embodiment of an output driver of the output adaptive output control circuit of FIG. 2.
Figure 4:
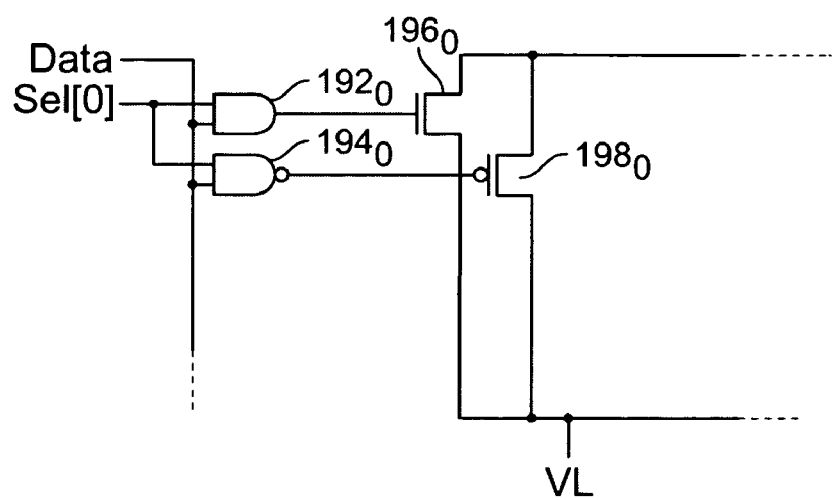
FIG. 4 is a schematic diagram of another embodiment of an output driver of the output adaptive output control circuit of FIG. 2.

FIG. 3 illustrates an embodiment of the driver output 140 in greater detail. Specifically, FIG. 3 shows an array of p-channel FETs $142_0$–$142_n$ coupled to an array of n-channel FETs $144_0$–$144_n$. Each FET is driven by an associated AND gate $172_0$–$172_n$, respectively. The AND gates $172_0$–$172_n$ each have a first input coupled to a data line and a second input coupled to a respective select line. The select lines are activated by the digital output of the third servo loop to select ones of the FETs to define a particular impedance level, as discussed above. A signal on the data line causes the selected FETs to conduct and thereby communicate a signal onto the transmission line. It should be appreciated that the p-channel FETs of the driver output 140 would have like driving circuitry. Each of the FETs may have the same drain-source resistance, or may be binary weighted in resistance. FIG. 4 illustrates an alternative embodiment of the driver output 140 that utilizes pairs of FETs for each select line. An n-channel/p-channel FET pair $196_0$, $198_0$ is driven by respective AND and NAND gates $192_0$, $194_0$.

The present embodiment is advantageous for use with multi-channel systems in which the digital driver in each channel operates under variable logic voltage levels, i.e., VH and VL, respectively, always matches a required transmission line impedance $Z_o$. It should be appreciated that VH and VL may be different in each channel, and the data rate through any driver is arbitrary. Since the calibration adjustment is a digital word, it is easily latched, and further calibration is only required if some condition, such as VH or VL, or temperature changes. The linear, analog portions of the calibration system may be powered-down between calibrations in the specific implementation. VH and VL can be as small as 0.5 V, and these levels can range anywhere between the 0 and +5 V supply rails.

While the driver output is illustrated above as comprised of CMOS pairs, i.e., a p-channel and an n-channel FET, making the output impedances in either direction very non-linear, no constraints are required of the linearity to achieve matching for digital signaling as long as the calibration is done with the outputs at the mid-voltage (VH+VL)/2. Under this condition, a signal edge launched into the transmission line will also reach this mid-voltage because of the voltage division caused by the equal impedances of the driver output and the transmission line, and be doubled to full amplitude at the transmission line output, assuming no resistive termination at the output end. The reflected wave back down the transmission line adds to the incident wave and, for matching, only requires that a full level signal at the driver output draws no current from the driver. Of course, that is the very definition of a full-level output signal, i.e., that the driver ceases to source or sink any more output current. So, the reflected wave and driver output impedances (voltages and currents) match, and there are no reflections generated. The driver output can be said to be matched to the transmission line.

It should be appreciated that the initial point matched impedance model described above is valid when the round trip of incident and reflected waves on the transmission line is longer than the signal rise time at the driver. This is common for digital signaling systems, and is assumed valid when a matched output drive is employed. In the general case, such as analog signaling, the driver is not at either rail when the reflected wave returns to the driver, and a linear output resistance is required to absorb the reflected wave. Although the foregoing implementation includes CMOS devices, it should be appreciated that the present invention would be applicable to other technologies and other topologies as well.

The adaptive output driver circuit of the present invention has numerous advantages over the prior art. The digital output drivers do not require any external components. The adaptive output driver circuit does not depend on actual signaling, nor on data density, so there is no "learning" time required for calibration. It does not require a dedicated transmission line trace, or a dedicated receiver. The model calibration may be done at a low frequency, and does not require any high-speed signals. This saves power and reduces generated noise on-chip. The calibration system, including the output model and the reference resistor, may be scaled to reduce power and area. Only one reference resistor is required for any number of drivers on a chip. Moreover, the control system can be very flexible, i.e., different output buffers can be calibrated to different output impedances, and it is possible to add user access to buffer control signals for custom adjustments. It is also possible to replace the variable reference resistor with a fixed reference plus user defined scaling. Alternatively, the reference resistor could be replaced by a known voltage and current, as convenient to the system. Or, the reference resistor could be integrated on chip if tolerances can be achieved, e.g., with a laser trimmed thin-film resistor or fuse-trimmed resistor array.

Having thus described a preferred embodiment of an adaptive output driver circuit, it should be apparent to those skilled in the art that certain advantages of the described method and apparatus have been achieved. It should also be appreciated that various modifications, adaptations, and alternative embodiments thereof may be made within the scope and spirit of the present invention. The invention is further defined by the following claims.

What is claimed is:

1. A circuit for communicating digital output signals onto a transmission line, comprising:
   a first servo generating a first digital signal defining a model resistance that substantially matches a predetermined impedance of said transmission line;
   a second servo receiving said first digital signal and scaling said model resistance for high (VH) and low (VL) output voltage rails of said transmission line;
   a third servo generating a second digital signal substantially correlating said scaled model resistance to a model transistor array; and
   an output driver having a working transistor array adapted to be coupled to said transmission line, said output driver receiving said second digital signal and activating selected transistors of said working transistor array in accordance therewith so that said working transistor array has an impedance substantially corresponding to said scaled model resistance;
   wherein, said impedance of said working transistor array substantially matches said predetermined impedance of said transmission line, and a digital output signal communicated by said output driver onto said transmission line has a voltage that is substantially one-half of a desired final voltage.

2. The circuit of claim 1, wherein said first servo further comprises a first comparator having a first input coupled to a reference resistor corresponding to said predetermined impedance of said transmission line and a second input coupled to a first variable resistor responsive to said first digital signal to substantially match said reference resistor.

3. The circuit of claim 2, wherein said first variable resistor further comprises a resistor array.

4. The circuit of claim 2, wherein said first comparator further comprises a successive-approximation register.

5. The circuit of claim 1, wherein said second servo further comprises a second comparator having a first input coupled to a resistor divider defining a voltage substantially midway between said high (VH) and low (VL) output voltage rails and a second input coupled to a second variable resistor responsive to said first digital signal to substantially match said reference resistor.

6. The circuit of claim 5, wherein said second variable resistor further comprises a resistor array.

7. The circuit of claim 5, wherein third first servo further comprises a third comparator having a first input coupled to said second variable resistor and a second input coupled to said model transistor array.

8. The circuit of claim 7, wherein said third comparator further comprises a successive-approximation register.

9. The circuit of claim 1, wherein said model transistor array is responsive to said second digital signal to substantially match said scaled model resistance.

10. The circuit of claim 1, wherein said working transistor array further comprises a push-pull configuration.

11. The circuit of claim 1, wherein said output driver further comprises an output control device that enables said output driver to communicate with said transmission line, said second servo further comprising a corresponding device providing corresponding resistance for inclusion in said scaled model resistance.

12. The circuit of claim 1, wherein said second servo, third servo, and output driver are associated with a first output channel coupled to said transmission line, and further comprising plural additional channels with each one having a like second servo, third servo, and output driver.

13. The circuit of claim 1, wherein said transistors of said working transistor array each have substantially identical drain-source resistance.

14. The circuit of claim 1, wherein said transistors of said working transistor array are binary weighted in resistance.

15. The circuit of claim 1, wherein said second servo generates a bias current corresponding to said scaled model resistance.

16. A method for communicating digital output signals onto a transmission line, comprising:
   defining a model resistance that substantially matches a predetermined impedance of said transmission line;
   scaling said model resistance for high (VH) and low (VL) output voltage rails of said transmission line;
   correlating said scaled model resistance to a model transistor array; and
   activating selected transistors of a working transistor array in accordance with said model transistor array so that an impedance of said working transistor array substantially matches said predetermined impedance of said transmission line; and
   communicating a digital output signal onto said transmission line having a voltage that is substantially one-half of a desired final voltage.

17. The method of claim 16, wherein said scaling step further comprises defining a voltage substantially midway between said high (VH) and low (VL) output voltage rails.

18. The method of claim 16, wherein scaling step further comprises generating bias current corresponding to said scaled model resistance.

19. The method of claim 16, wherein said defining step further comprises performing a successive-approximation of said predetermined impedance of said transmission line.

20. The method of claim 16, wherein said correlating step further comprises performing a successive-approximation of said scaled model resistance.

21. The method of claim 16, further comprising selecting said transistors of said working transistor array to have substantially identical drain-source resistance.

22. The method of claim 16, further comprising selecting said transistors of said working transistor array to be binary weighted in resistance.

* * * * *